United States Patent
Eguchi et al.

(10) Patent No.: US 8,977,914 B2
(45) Date of Patent: Mar. 10, 2015

(54) STRESS-BASED TECHNIQUES FOR DETECTING AN IMMINENT READ FAILURE IN A NON-VOLATILE MEMORY ARRAY

(75) Inventors: Richard K. Eguchi, Austin, TX (US); Chen He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 270 days.

(21) Appl. No.: 13/483,968

(22) Filed: May 30, 2012

(65) Prior Publication Data

US 2013/0326285 A1 Dec. 5, 2013

(51) Int. Cl.
*G11C 29/00* (2006.01)

(52) U.S. Cl.
USPC .................................................. 714/718

(58) Field of Classification Search
CPC .. G11C 16/26; G11C 29/42; G11C 29/50004; G11C 29/04; G11C 29/52; G11C 16/3422; G11C 16/3431; G11C 29/06; G06F 11/1048
USPC .................... 714/721, E11.024, 48, 718, 746; 365/200, 201, 185.33
See application file for complete search history.

(56) References Cited

U.S. PATENT DOCUMENTS

| | | |
|---|---|---|
| 6,226,200 B1 | 5/2001 | Eguchi et al. |
| 7,450,425 B2 | 11/2008 | Aritome |
| 7,865,797 B2 | 1/2011 | Eguchi et al. |
| 8,095,836 B2 * | 1/2012 | Eguchi et al. .............. 714/723 |
| 8,504,884 B2 * | 8/2013 | Eguchi et al. .............. 714/721 |
| 2011/0107160 A1 * | 5/2011 | Eguchi et al. .............. 714/704 |
| 2011/0107161 A1 | 5/2011 | Eguchi et al. |

OTHER PUBLICATIONS

Richard K. Eguchi et al., Threshold Voltage Techniques for Detecting an Imminent Read Failure in a Memory Array, U.S. Appl. No. 12/608,405, filed Oct. 29, 2009.

* cited by examiner

*Primary Examiner* — Phung M Chung
(74) *Attorney, Agent, or Firm* — Yudell Isidore PLLC (57) ABSTRACT

A technique for detecting an imminent read failure in a non-volatile memory array includes applying a bulk read stress to a plurality of cells of the non-volatile memory array and determining whether the plurality of cells exhibit an uncorrectable error correcting code (ECC) read during an array integrity check at a margin read verify voltage level subsequent to the bulk read stress. The technique also includes providing an indication of an imminent read failure for the plurality of cells when the plurality of cells exhibit the uncorrectable ECC read during the array integrity check. In this case, the margin read verify voltage level is different from a normal read verify voltage level.

18 Claims, 6 Drawing Sheets

STRESS-BASED TECHNIQUES FOR DETECTING AN IMMINENT READ FAILURE IN A NON-VOLATILE MEMORY ARRAY

BACKGROUND

1. Field

This disclosure relates generally to detecting an imminent read failure in a non-volatile memory array and, more specifically, to stress-based techniques for accelerating and detecting an imminent read failure in a non-volatile memory array.

2. Related Art

Hamming code, which is one of the most commonly implemented error correcting codes (ECCs), allows a single-bit error to be detected and corrected and (in the usual configuration, with an extra parity bit) double-bit errors to be detected (but not corrected). Various memory controllers are designed to support ECC. Most low-cost ECC-capable memory controllers only detect and correct single-bit errors of a word, e.g., a 64-bit word, and detect (but not correct) errors of two bits per word. For example, an ECC word checkbase for a 64-bit word may include seventy-two bits (i.e., sixty-four data bits and eight parity bits). Other ECC-capable memory controllers are capable of detecting and correcting multiple bits per word.

ECC has been employed in non-volatile memory (NVM) applications. For example, embedded NVM (eNVM) employed in automotive applications has implemented ECC to correct read failures. In general, a read failure occurs when what was programmed into a cell (data or code) is not read out of the cell. For example, in a typical NVM (e.g., a Flash memory) a digital one and a digital zero in a cell are indicated by a different charge. As one example, a cell that is charged may indicate a digital zero and a cell that is not charged may indicate a digital one. An NVM cell can gain or lose electrons if the cell is defective. In a typical NVM, a cell error is a hard error. That is, in a typical NVM, a cell that gains electrons will not subsequently lose electrons. Similarly, in a typical NVM, a cell that loses electrons will not subsequently gain electrons.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. In particular, although the preferred embodiment is described below in conjunction with a microcontroller, it will be appreciated that the present invention is not so limited and may potentially be embodied in various systems that include a non-volatile memory array that is subject to read failures. As may be used herein, the term 'coupled' includes a direct electrical connection between elements or components and an indirect electrical connection between elements or components achieved using one or more intervening elements or components.

Today, it is a relatively common practice for various systems to implement error correcting code (ECC) memory. Although ECC cannot protect against catastrophic failure, ECC (depending on the implementation) is generally effective in correcting bit/column errors. The techniques disclosed herein are substantially independent of technology and may be used on any non-volatile memory (NVM) that includes a memory (bit) cell that drifts with part usage. In general, a bit in a defective NVM cell moves toward a normal read verify voltage level and is eventually read incorrectly. In order to approach zero defects in safety critical applications (e.g., automotive microcontroller applications, such as braking systems, airbag systems, collision avoidance systems, and rollover avoidance systems), it is desirable to predict an uncorrectable read of an NVM employed in the safety critical application in order to facilitate imminent failure notification.

In general, customers are comfortable with error correction capabilities employed to correct NVM errors. However, customers generally desire to have the ability to identify whether an uncorrectable read of an NVM (which could result in an accident when employed in an automotive application) may occur during operation of a safety critical application. According to various aspects of the present disclosure, techniques are implemented to determine if an uncorrectable ECC read failure, i.e., imminent read failure, is approaching when an ECC correction is detected. The techniques may be readily employed to detect imminent read failures on NVMs (e.g., embedded NVMs) that implement ECC as part of a read path. In various embodiments, the techniques utilize a post ECC path read and a read at a margin threshold voltage (Vt) level to detect imminent read failures. The techniques may, for example, be implemented within user mode diagnostics to identify imminent read failures.

For example, when an ECC implementation is only capable of single-bit correction, the ECC provides protection against the first failing bit in a group of bits (i.e., an ECC word checkbase) but cannot correct multiple failing bits in the ECC word checkbase. A single-bit ECC correction may not be an accurate indication of imminent read failure of an NVM and may result in functional parts being returned to a vendor. According to an embodiment of the present disclosure, ECC is combined with a margin read that is confined to an ECC word checkbase (with a pre-existing ECC correction) to provide accurate techniques for predicting an imminent read failure of an NVM. While the discussion herein is primarily directed to single-bit ECC correction and double-bit ECC detection, it should be appreciated that the techniques disclosed herein are applicable to multiple-bit ECC correction and detection. Moreover, while the discussion herein is primarily directed to automotive applications, it should be appreciated that the techniques disclosed herein are not limited to a particular field.

As one example, circuitry may be implemented that includes: a stress circuit capable of applying a bulk high voltage (HV) read stress to an NVM (bit) cell array; an address generator; an ECC circuit; and a margin read circuit that includes a threshold voltage level adjuster. In this case, the stress circuit is used to apply bias on a portion (e.g., a plurality of cells) or all of the rows and columns of the NVM bit cell array. The address generator is used to read all locations (or a portion of the locations) within an NVM. For example, an array integrity (AI) check (test) may be performed by implementing (in conjunction with the address generator) a multiple input signature register (MISR), which performs an algorithm on a sequence of read data to provide signatures for the sequence of read data at various times. The AI check then compares subsequent signatures of the sequence of read data (when read at a later point in time) to an initial signature to identify read failures. The ECC circuit identifies whether a read needed a correction to pass (as well as identifying whether a read could not be corrected due to too many failures in the ECC word checkbase). The margin read circuit is then used to perform a read at one or more margin read verify voltage levels.

The threshold voltage level adjuster is a circuit that changes a gate voltage (above or below a normal read verify voltage level) of a field-effect transistor (FET) of a cell such that a read can be performed at a desired margin read verify voltage level. In this case, a drain of the FET may be set to about 0.5V and a source of the FET may be grounded. The threshold voltage adjuster may be implemented with, for example, a resistor tree whose output voltage is controlled through a register write (to a resistor tree register) to select a desired notch on the resistor tree. For example, if a gate voltage for a normal read is 4.2V, a gate voltage for a margin read to check programmed bits may be 4.7V. As another example, if a gate voltage for a normal read is 4.2V, a gate voltage for a margin read to check erased bits may be 3.7V.

In either case, the margin read data is fed to the ECC to see if any resulting error is correctable. If any resulting error is correctable, an imminent read failure is not indicated. On the other hand, if any resulting error is not correctable, an imminent read failure is indicated. For example, an imminent read failure may be indicated for a single-bit ECC approach when two or more bits fail to read correctly at a margin read verify voltage level. In an alternative embodiment, the threshold voltage level adjuster may implement a current-based approach. The threshold voltage technique may also be utilized to identify the least erased or least programmed bits in an NVM array.

According to one embodiment of the present disclosure, a technique for detecting an imminent read failure in an NVM array includes applying a bulk read stress on the NVM array and determining, when the NVM array does not exhibit an uncorrectable error correcting code (ECC) read during an initial array integrity (AI) check at a normal read verify voltage level that is subsequent to the bulk read stress, whether the NVM array exhibits an uncorrectable ECC read during a subsequent array integrity check at a margin read verify voltage level. The technique also includes providing an indication of an imminent read failure for the NVM array when the NVM array exhibits an uncorrectable ECC read during the subsequent AI check. In this case, the margin read verify voltage level is different from the normal read verify voltage level. For example, the margin read verify voltage level may be greater than the normal read verify voltage level by about 0.5V or less than the normal read verify voltage level by about 0.5V. In a typical case, the AI check is performed immediately following the bulk read stress (e.g., the AI check is performed within a few microseconds of the bulk read stress).

In one embodiment, the bulk read stress (or HV accelerated bias) applies a gate bias voltage (e.g. 6V), which is higher than the normal read voltage (e.g., 4.2V), on even gates (rows) of the NVM cells and a drain bias voltage, e.g., 0.5V, on all even drain (columns) of the NVM cells for a predetermined stress duration, e.g., 3 minutes. The bulk read stress then applies a gate bias voltage, e.g. 6V, on all odd gates (rows) of the NVM cells and a drain bias voltage, e.g., 0.5V, on all odd drains (columns) of the NVM cells for a predetermined stress duration, e.g., about 3 to 6 minutes. In this manner, all NVM cells undergo the same stress condition in two passes. In general, the stress duty cycle and the stress duration for each address location shows great improvement in detection of imminent read failures, as compared to conventional approaches which have read through of an entire memory address space (millions of address locations), with each read location typically receiving nanoseconds of read bias voltages and not receiving another read bias until the read loops back to the same address. It should be appreciated that the gate and drain biases may take on various values. For example, a value of the gate bias may be in a range of between about 4.2V to 6.0V and a value of the drain bias may be in a range of between about 0.0V and 0.5V.

Typically, the elevated gate voltage (e.g., 6V versus 4.2V for a normal read) helps to accelerate the charge movement of latent defects. In general, stressing all even gate and columns followed by odd gate and columns helps push and pull charge on a defective bit leakage path to highlight both charge loss and charge gain defect mechanisms. In another embodiment, the bulk read stress can be performed with all gates at 6V during a first pass with odd drains (columns) receiving a bias of 0.5V and a second pass with even drains (columns) receiving a bias of 0.5V. In another embodiment, the bulk read stress can be performed with all gates (rows) at 6V and all drains (columns) at 0.5V. In other embodiments, the stress bias conditions and durations can be adjusted to account for different failure mechanisms in different NVM technologies. A wide variety of data patterns may be employed for a bulk read stress. For example, an employed data pattern may correspond to a physical checkerboard pattern or an inverse physical checkerboard pattern in which half of the NVM array cells are programmed and the other half are erased and cells on adjacent columns have opposite state.

According to yet another embodiment of the present disclosure, a memory system includes an NVM array and a circuitry coupled to the NVM array. The circuitry is configured to apply a bulk read stress on the NVM array and perform an initial array integrity (AI) check on the NVM array at a normal read verify voltage level subsequent to the bulk read stress. The circuitry is also configured to determine whether the initial AI check on the NVM array passed at the normal read verify voltage level without using ECC correction and (when the array integrity check on the NVM array did not pass at the normal read verify voltage level without using the ECC correction) determine whether the NVM array is ECC correctable. The circuitry performs, when the NVM array is ECC correctable, a subsequent AI check of the NVM array at a margin read verify voltage level. The circuitry is also configured to indicate an imminent read failure for the NVM array when the NVM array exhibits an uncorrectable ECC read during the subsequent AI check. In various embodiments, the normal read verify voltage level is different that the margin read verify voltage level.

Figure 1:
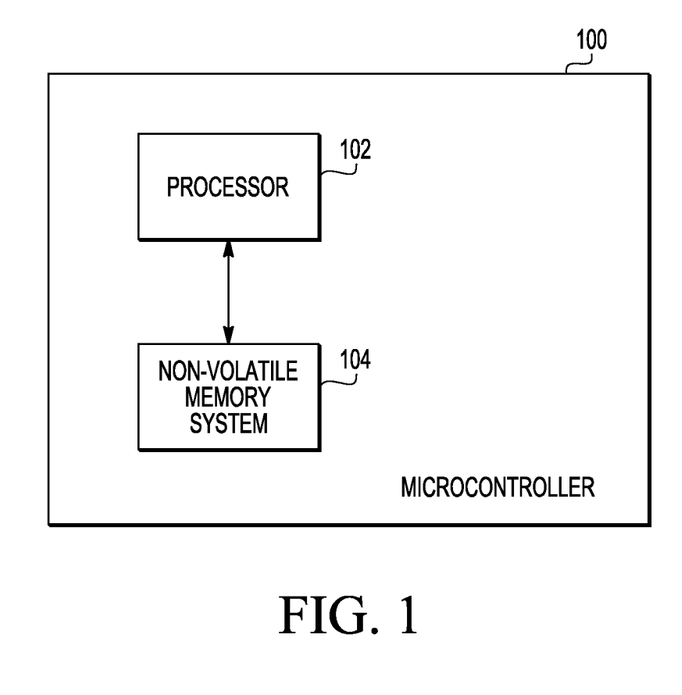
FIG. 1 is a diagram of an example system (in this case a microcontroller) that includes a processor and a non-volatile memory (NVM) system configured according to the present invention.

With reference to FIG. 1, an example microcontroller 100 is illustrated that includes a processor 102 and a non-volatile memory (NVM) system 104 coupled to the processor 102. In one or more embodiments, the NVM system 104 includes an NVM memory array, as well as a stress circuit, an ECC circuit, and a margin read circuit (see FIG. 5). In one or more other embodiments, the stress, ECC, and margin read circuits may be in a different functional block than the NVM system 104. The NVM system 104 may also include an address generator and a threshold voltage level adjuster (see FIG. 5). The address generator and the threshold voltage level adjuster (included in the margin read circuit) may be located in a different functional block than the NVM system 104. As noted above, the address generator is used to read all locations (or a portion of the locations) within an NVM array. An array integrity (AI) check may be performed by implementing a multiple input signature register (MISR) that performs an algorithm on a sequence of read data to provide signatures for the sequence of read data at various times. The AI check is configured to compare subsequent signatures of the sequence of read data (when read at a later point in time) to an initial signature to identify read failures. As is also noted above, the threshold voltage level adjuster is used to perform a read at a margin read verify voltage level.

Figure 2:
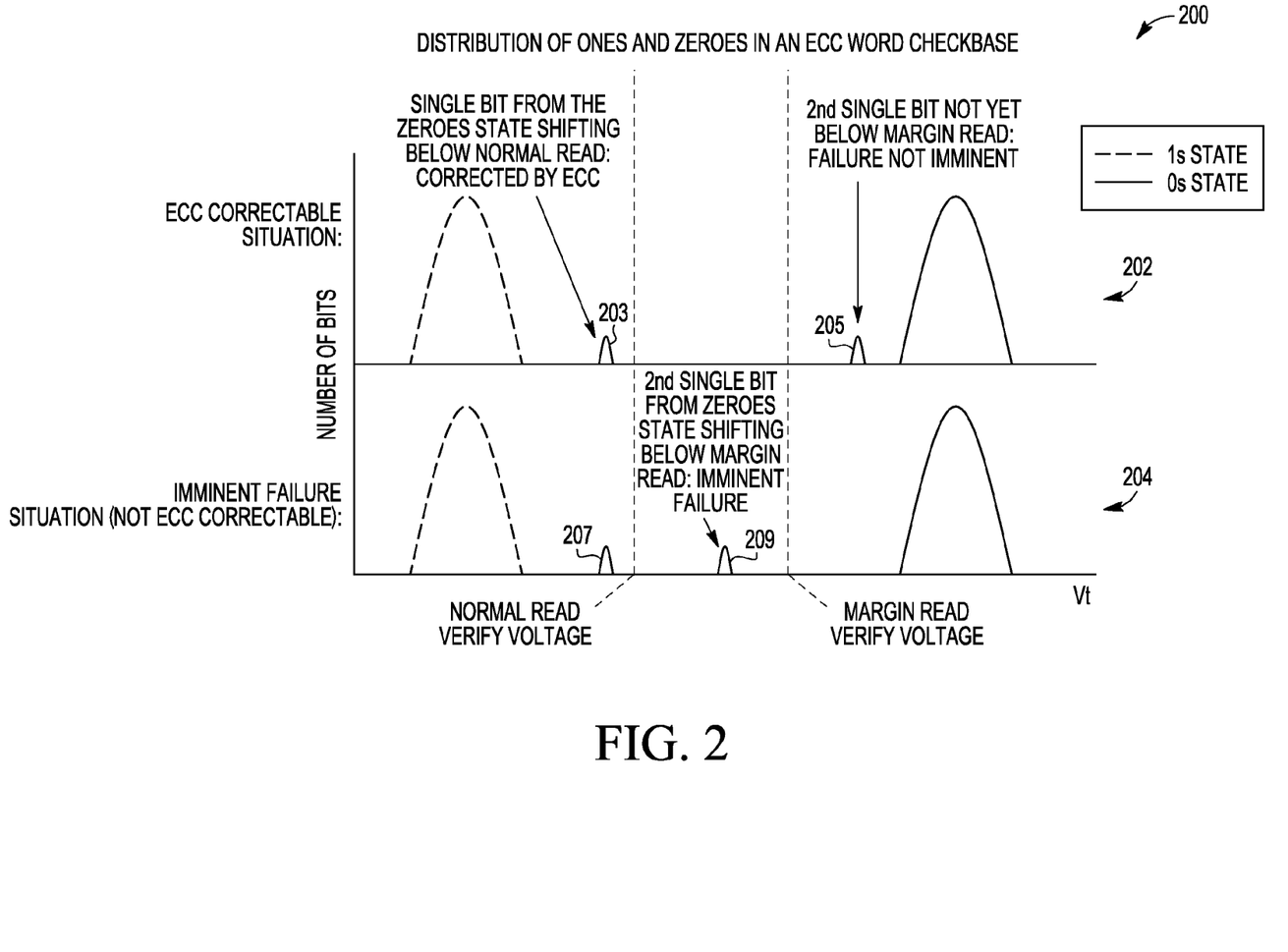
FIG. 2 is an example graph for an error correcting code (ECC) word checkbase that illustrates an ECC correctable situation and an ECC uncorrectable situation in which an imminent read failure is indicated.

With reference to FIG. 2, a graph 200 depicts a distribution of ones (i.e., erased bits) and zeroes (i.e., programmed bits) in an ECC word checkbase. In this example, bits with threshold voltage values above a normal read verify voltage level read as logical zeroes and bits with threshold voltage values lower than the normal read verify voltage level read as logical ones. In one or more alternate embodiments, bits with threshold voltage values below a normal read verify voltage level read as logical zeroes and bits with threshold voltage values higher than the normal read verify voltage level read as logical ones. As is shown, upper graph section 202 illustrates an ECC correctable situation in which a first single bit 203 (that has shifted from a zeroes state to below the normal read verify voltage level) is corrected by an ECC and a second single bit 205 that has not yet shifted below a margin read verify voltage level and, as such, does not indicate an imminent read failure. In contrast, lower graph section 204 illustrates an ECC correctable situation in which a first single bit 207 (that has shifted below a normal read verify voltage level) is corrected by the ECC and a second single bit 209 that has shifted below a margin read verify voltage level and, as such, indicates an imminent read failure for an NVM array in an NVM system that includes an ECC that can only correct a single-bit.

Figure 3:
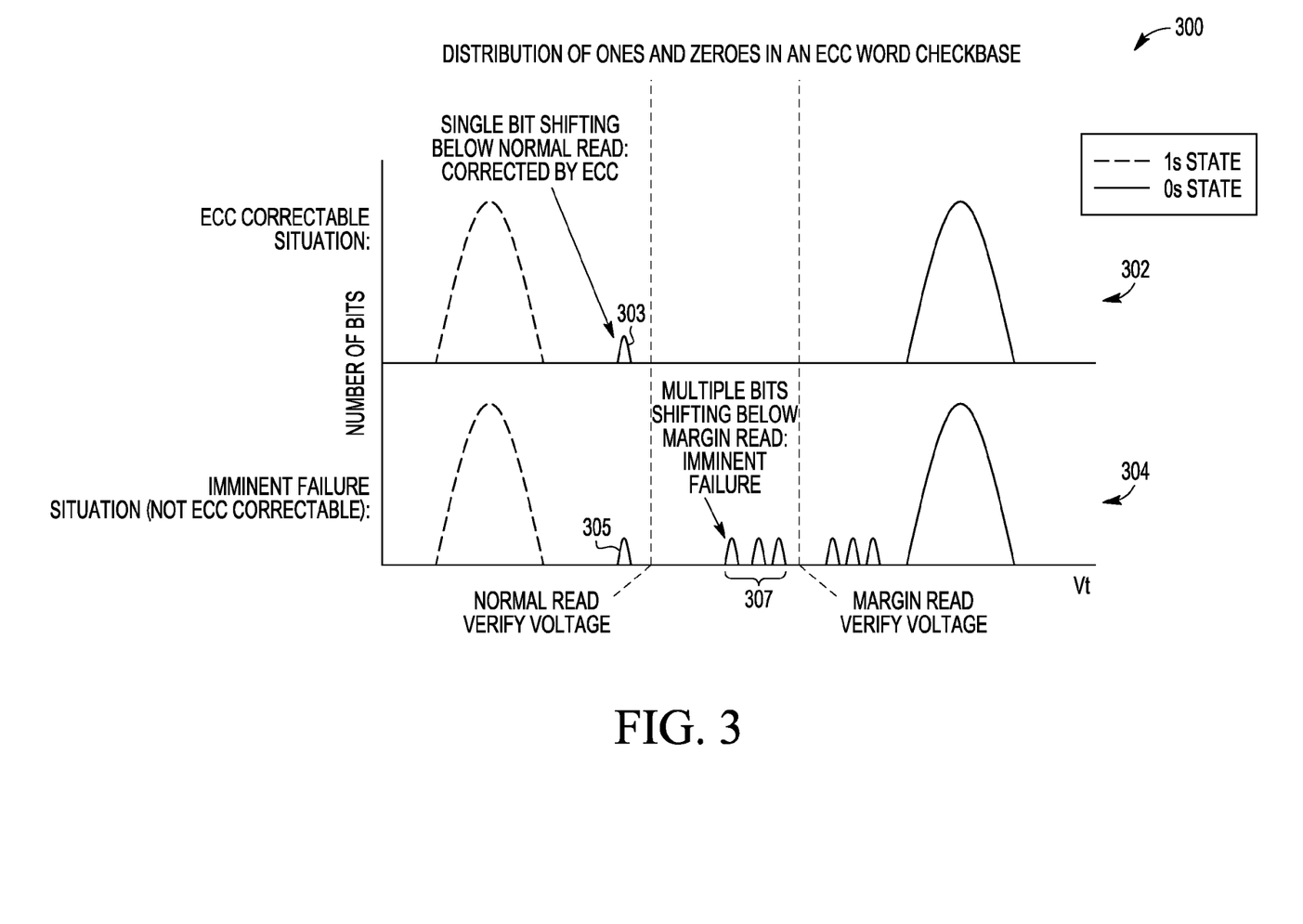
FIG. 3 is another example graph for an ECC word checkbase that illustrates an ECC correctable situation and an ECC uncorrectable situation in which an imminent read failure is indicated.

With reference to FIG. 3, a graph 300 depicts another distribution of ones and zeroes in an ECC word checkbase. As is shown, upper graph section 302 illustrates an ECC correctable situation in which a first single bit 303 (that has shifted below a normal read verify voltage level) is corrected by the ECC and, as such, an imminent read failure is not indicated. In contrast, lower graph section 304 illustrates an ECC correctable situation in which a first single bit 305 (that has shifted below a normal read verify voltage level) is corrected by the ECC and multiple bits 307 (that have shifted below a margin read verify voltage level) indicate an imminent read failure for an NVM array in an NVM system that includes an ECC that can only correct a single-bit.

It should be appreciated that FIGS. 2 and 3 illustrate examples of defective programmed bits (bits shifted down from the zeroes state) which might cause an imminent read failure. It should also be appreciated that an imminent read failure may also occur on erased bits (bits shifted up from the ones state).

Figure 4:
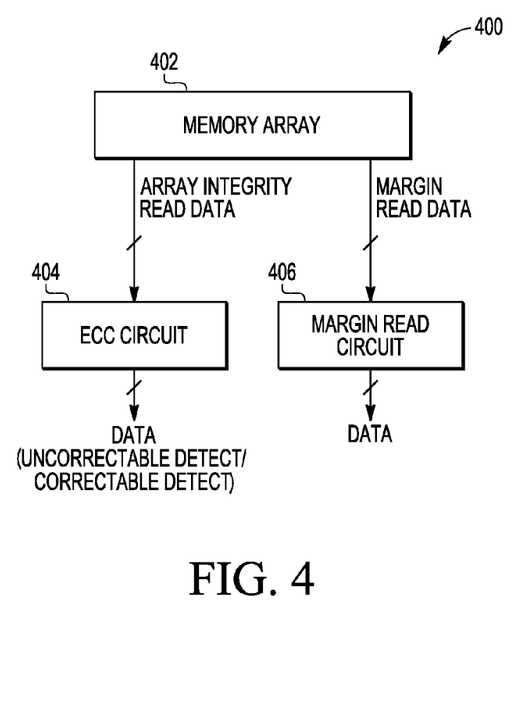
FIG. 4 is a diagram of a conventional NVM system that employs an ECC circuit and a margin read circuit.

Turning to FIG. 4, a conventional memory system 400 is illustrated that includes a non-volatile memory array 402 and an ECC circuit 404 in a read path of the non-volatile memory array 402. As is also shown, the memory system 400 includes a margin read circuit 406 that is utilized to determine whether bits of the non-volatile memory array 402 pass at a margin read verify voltage level. It should be appreciated that an output of the margin read circuit 406 is not coupled to an input of the ECC circuit 404. As such, the ECC circuit 404 is not available to determine whether a read failure (as indicated by an output of the margin read circuit 406) is correctable.

Figure 5:
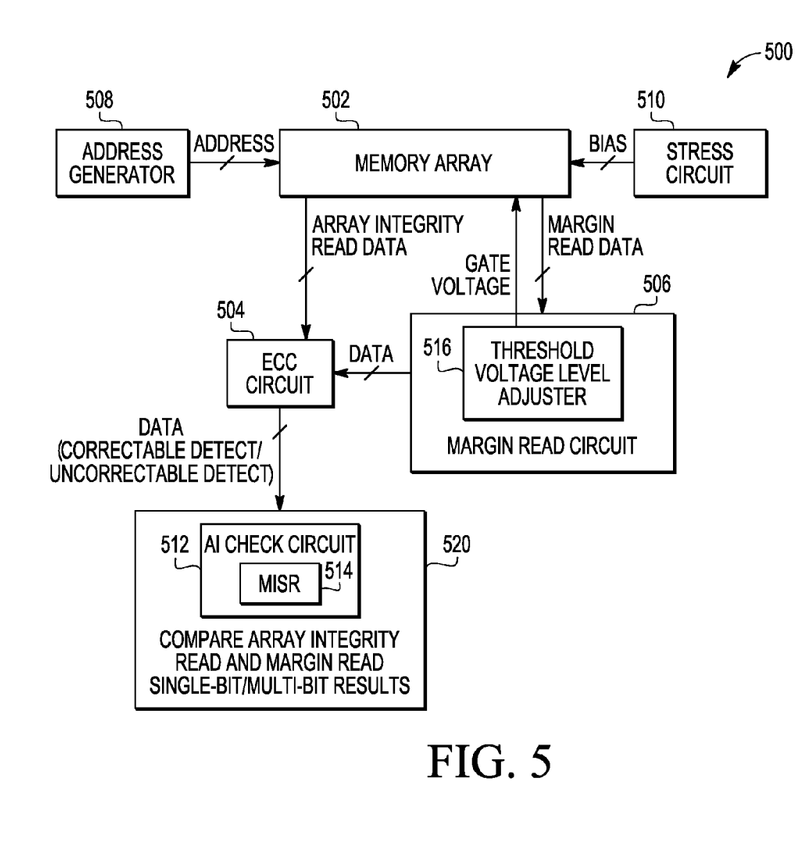
FIG. 5 is a diagram of an NVM system that employs an ECC circuit and a margin read circuit, among other circuits, according to various embodiments of the present invention.

With reference to FIG. 5, a memory system 500 is illustrated that includes a non-volatile memory (NVM) array 502, an ECC circuit 504 (in a read path of the NVM array 502), a margin read circuit 506 (including a threshold voltage adjuster 516), an address generator 508, a stress circuit 510, and a compare circuit 520 (including an array integrity (AI) check circuit 512 and a multiple input signature register (MISR) 514). The memory system 500 may, for example, correspond to the NVM system 104 of FIG. 1. The stress circuit 510 is used to apply bias on a portion (e.g., a plurality of cells) or all of the rows and columns (i.e., all of the cells) of the NVM array 502. As one example, the stress circuit 510 may be part of a memory controller. In any case, the stress circuit 510 is coupled to each cell of the NVM array 502, via row decoder and column decoder circuitry (not shown). The address generator 508 is used to read all (or desired) locations within the NVM array 502.

An array integrity (AI) check may be performed by implementing (in conjunction with the address generator 508) the MISR 514, which performs an algorithm on a sequence of read data to provide signatures for the sequence of read data at various times. The compare circuit 520 then compares subsequent signatures of the sequence of read data (when read at a later point in time) to an initial signature to identify read failures. The ECC circuit 504 identifies whether a read needed a correction to pass (as well as identifying whether a read could not be corrected due to too many failures in the ECC word checkbase). The margin read circuit 506 is used to perform a read at one or more margin read verify voltage levels.

The threshold voltage level adjuster 516 (which is coupled to a wordline driver) changes a wordline/gate voltage (above or below a normal read verify voltage level) of a field-effect transistor (FET) of a cell such that a read can be performed at a desired margin read verify voltage level. In this case, a drain of the FET may be set to about 0.5V and a source of the FET may be grounded. The threshold voltage adjuster 516 may be implemented with, for example, a resistor tree whose output voltage is controlled through a register write (to a resistor tree register) to select a desired notch on the resistor tree. For example, if a gate voltage for a normal read is 4.2V, a gate voltage for a margin read to check programmed bits may be 4.7V. As another example, if a gate voltage for a normal read is 4.2V, a gate voltage for a margin read to check erased bits may be 3.7V.

In either case, the margin read data is fed (from the margin read circuit 506) to the ECC circuit 504, which determines if any resulting error is correctable. If any resulting error is correctable, an imminent read failure is not indicated. On the other hand, if any resulting error is not correctable, an imminent read failure is indicated. For example, an imminent read failure may be indicated for a single-bit ECC approach when two or more bits fail to read correctly at a margin read verify voltage level. In an alternative embodiment, the threshold voltage level adjuster 516 may implement a current-based approach. The threshold voltage technique may also be utilized to identify the least erased or least programmed bits in an NVM array. While the address generator 508 and the stress circuit 510 are illustrated as separate circuits they may be implemented within other circuits. Similarly, while the compare circuit 520 is illustrated as including the AI check circuit 512, which is illustrated as including the MISR 514, the circuits 520, 512 and 514 may be implemented separately or in combination with different circuitry. It should be appreciated that an output of the margin read circuit 506 is coupled to an input of the ECC circuit 504. As such, the ECC circuit 504 is available to determine whether a read failure (as indicated by an output of the margin read circuit 506) is correctable.

Figure 6:
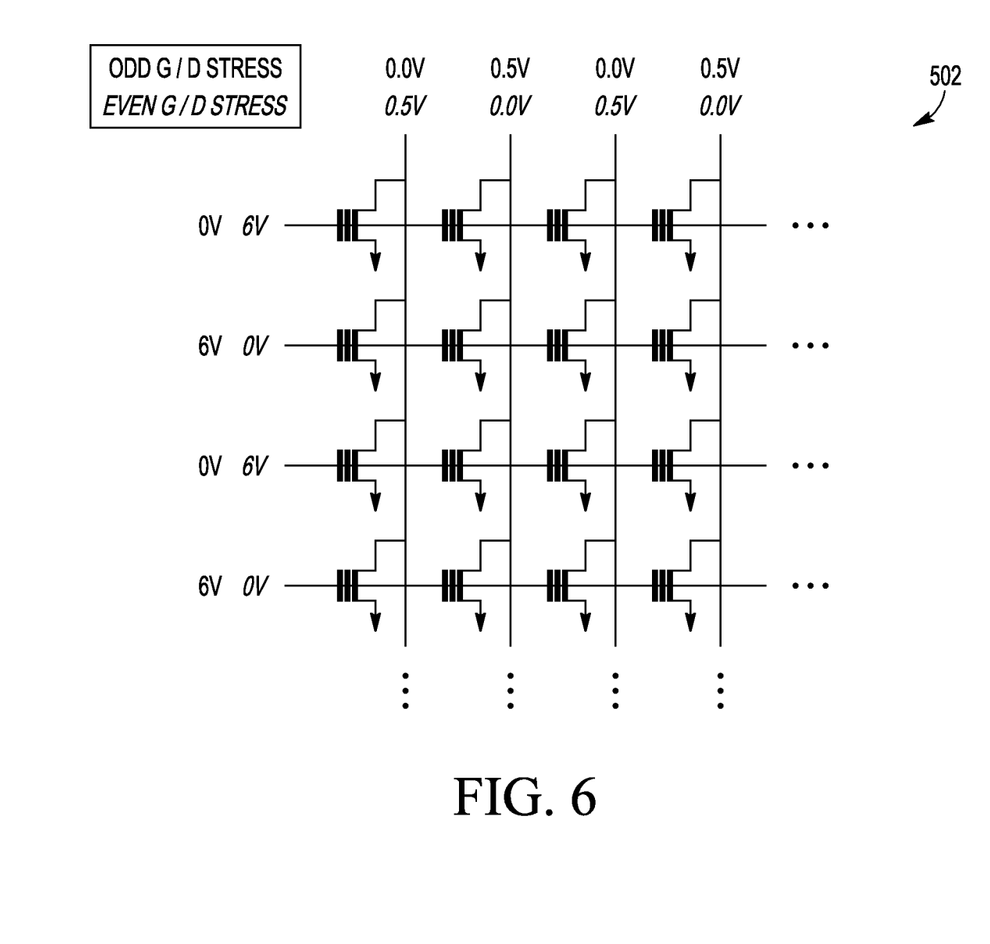
FIG. 6 is a diagram of an NVM array with a bulk high voltage (HV) read stress condition implemented according to one embodiment of the present invention.

FIG. 6 shows an example of bulk read stress condition on a relevant portion of the NVM array 502 according to one embodiment. It should be appreciated that voltages different from the gate and drain voltages listed below may be utilized to stress cells of an NVM array. According to one embodiment, all even rows (gates) of the NVM array 502 are biased with 6V while all odd rows (gates) are grounded and all even columns (drains) of the NVM array 502 are biased with 0.5V while all odd columns (drains) of the NVM array 502 are grounded. This bias condition is maintained for a predetermined duration, e.g., about 3 to 6 minutes, to stress all the even rows and columns. Then all odd rows (gates) of the NVM array 502 are biased with 6V while all even rows (gates) are grounded, and all odd columns (drains) of the NVM bit cell array 502 are biased with 0.5V while all even columns (drains) of the NVM bit cell array 502 are grounded. This bias condition is maintained for another predetermined duration, e.g., about 3 to 6 minutes, to stress all the odd rows and columns.

Figure 7:
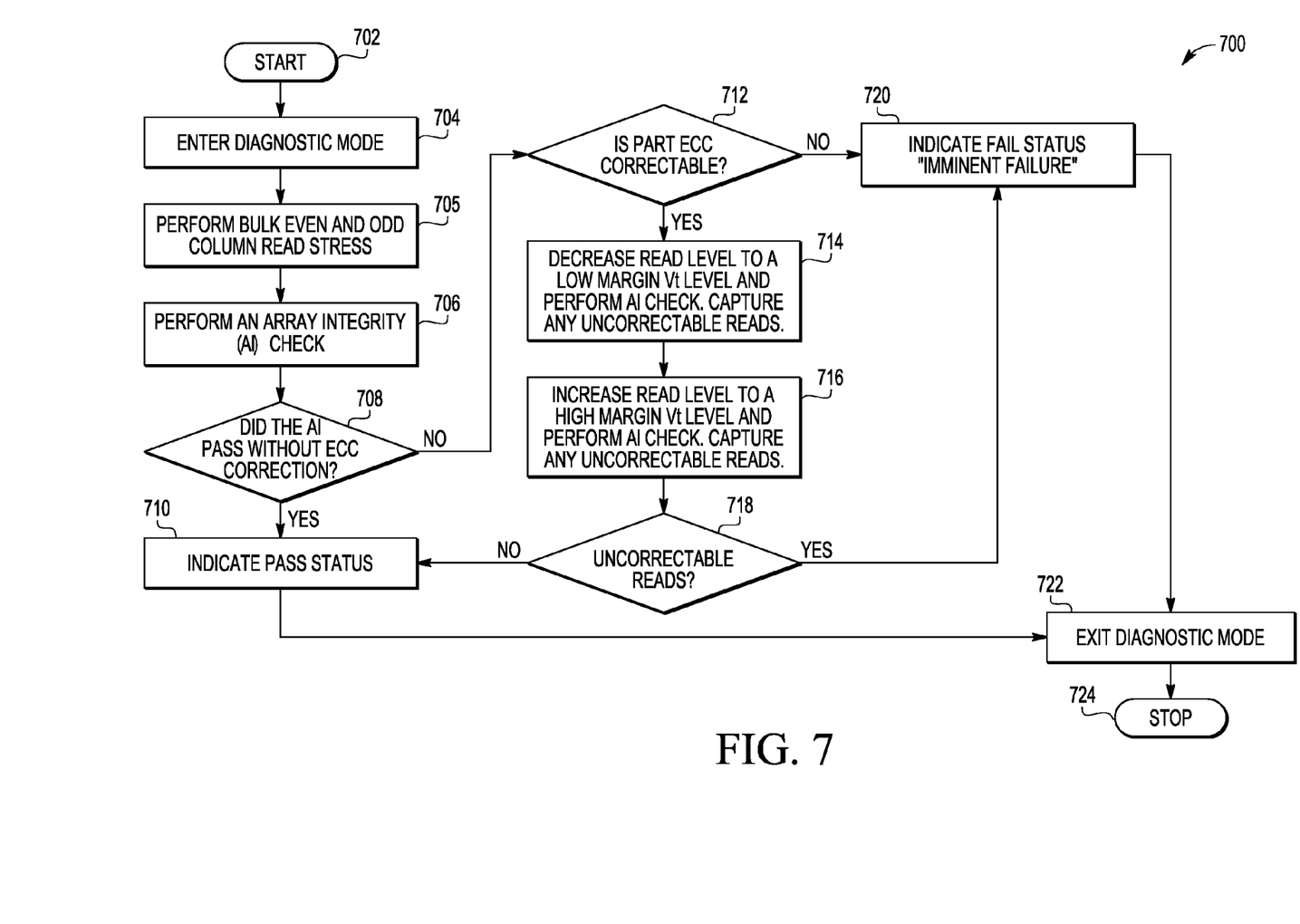
FIG. 7 is a flowchart of a process for detecting an imminent read failure in an NVM array according to one embodiment of the present invention.

With reference to FIG. 7, a process 700 is illustrated that implements stress-based techniques for detecting an imminent read failure in a non-volatile memory array (e.g., NVM array 502 included in the NVM system 104 of FIG. 1). The process 700 (which may, for example, be initiated by the processor 102 of FIG. 1 in response to appropriate control registers being programmed by an external tester) is initiated in block 702, at which point control transfers to block 704, when a diagnostic mode is entered (e.g., by being selected by a technician when the vehicle is in a safe state such as in the garage). From block 704 control transfers to block 705, where a bulk read stress (e.g., a bulk even row and even column read stress and/or bulk odd row and odd column read stress as shown in FIG. 6) is performed using the stress circuit 510 (see FIG. 5). For example, the bulk read stress (e.g., 6V applied to all even gates and 0.5V applied on all even drains) may be performed for a predetermined period (e.g., 3 minutes). A bulk read stress (e.g., 6V applied to all odd gates and 0.5V applied on all odd drains) may then also be performed for a predetermined period (e.g., 3 minutes).

Next, in block 706 an array integrity (AI) check is performed at a normal read verify voltage level. As noted above, an AI check may be implemented by circuitry that includes the address generator 508, the ECC circuit 504, and the threshold voltage level adjuster 516 of the margin read circuit 506. In this case, the address generator 508 is used to read all locations (or a portion of the locations) within the NVM array 502. For example, the AI check may be performed by implementing (in conjunction with the address generator 508) the MISR 514, which performs an algorithm on a sequence of read data to provide signatures for the sequence of read data at various times. The AI check then compares subsequent signatures of the sequence of read data (when read at a later point in time) to an initial signature to identify read failures. As noted above, the ECC circuit 504 identifies whether a read needed a correction to pass (as well as identifying whether a read could not be corrected due to too many failures in an ECC word checkbase). As is discussed in further detail below, the threshold voltage level adjuster 516 is then used to perform a read at one or more margin read verify voltage levels.

Next, in decision block 708, the process 700 determines whether the AI check passed without ECC correction. If the AI check passed in block 708 without ECC correction (as, for example, indicated by an ECC flag), control transfers to block 710 where a pass status is indicated. If the AI check did not pass in block 708 without ECC correction, control transfers to decision block 712, where the process 700 determines whether the part is ECC correctable (as, for example, indicated by an ECC flag). If the NVM array 502 is not ECC correctable in block 712, control transfers to block 720 where a fail status is indicated.

If the NVM array 502 is ECC correctable in block 712, control transfers to block 714 where a read level is decreased to a low margin threshold voltage to check expected erased bits and another AI check is performed. In block 714, any uncorrectable reads are captured. Next, in block 716, a read level is increased to a high margin threshold voltage to check expected programmed bits and yet another AI check is performed. In block 716, any uncorrectable reads are captured. Then, in decision block 718, the process 700 determines whether any uncorrectable reads were captured in blocks 714 and 716. If no uncorrectable reads were captured in blocks 714 and 716, control transfers from block 718 to block 710. If uncorrectable reads were captured in blocks 714 or 716, control transfers from block 718 to block 720. Following blocks 710 and 720, control transfers to block 722 (where the diagnostic mode is exited) and then to block 724 (where control returns to a calling process and the process 700 is terminated). It should be appreciated that only one of blocks 714 and 716 may be implemented or the execution order of the blocks 714 and 716 may be reversed, if desired. Depending on the technology, margin reads may be employed to detect an imminent read failure without first detecting a correctable read at a normal read verify voltage level. According to this aspect of the present disclosure, the ECC is utilized to detect an uncorrectable read at a margin read verify voltage level. It should be appreciated that a wide variety of data patterns may be employed for a bulk read stress. For example, an employed data pattern may correspond to a physical checkerboard pattern or an inverse physical checkerboard pattern.

Accordingly, various techniques have been disclosed herein that detect an imminent uncorrectable read situation for a non-volatile memory array prior to an actual occurrence of an uncorrectable read situation by applying a bulk read stress to the non-volatile memory array. The techniques advantageously accelerate imminent read failures and provide a better indication of when a part is actually defective and reduce the number of non-defective parts returned to a vendor. Employing a bulk read stress facilitates acceleration and detection of imminent read failures at an ideal and safe time, e.g., in a garage during maintenance when a key of an automobile is off.

Although the invention is described herein with reference to specific embodiments, various modifications and changes can be made without departing from the scope of the present invention as set forth in the claims below. For example, many of the techniques disclosed herein are broadly applicable to a variety of memory technologies employed in various systems. Accordingly, the specification and figures are to be regarded in an illustrative rather than a restrictive sense, and all such modifications are intended to be included within the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of detecting an imminent read failure in a non-volatile memory array, comprising:
    applying a gate bias voltage, higher than a normal read verify voltage level, to a plurality of cells of the non-volatile memory array for a duration of time, wherein the normal read verify voltage level is a voltage level applied to a gate of a cell of the plurality of cells of the non-volatile memory array to determine a value stored by the cell;
    after the applying the gate bias voltage for the duration of time, determining whether the plurality of cells exhibit an uncorrectable error correcting code (ECC) read during an array integrity check at a margin read verify voltage level, wherein the margin read verify voltage level is either higher than the normal read verify voltage level for the plurality of cells or lower than the normal read verify voltage level for the plurality of cells; and
    providing an indication of an imminent read failure when the plurality of cells exhibit the uncorrectable ECC read during the array integrity check.

2. The method of claim 1, further comprising:
    after the applying the gate bias voltage for the duration of time, providing an indication of a read pass when the plurality of cells pass an initial array integrity check without an ECC correction, wherein the determining only occurs when the plurality of cells exhibit a correctable ECC read during the initial array integrity check at the normal read verify voltage level.

3. The method of claim 1, wherein the margin read verify voltage level is either greater than the normal read verify voltage level by about 0.5V or less than the normal read verify voltage level by about 0.5V.

4. The method of claim 1, wherein the applying the gate bias voltage to the plurality of cells further comprises:
    applying the gate bias voltage, higher than the normal read voltage of the non-volatile memory array, to all even gates of the plurality of cells and a drain bias voltage to all even drains of the plurality of cells for the duration of time; and
    applying the gate bias voltage, higher than the normal read voltage of the non-volatile memory array, to all odd gates of the plurality of cells and the drain bias voltage on all odd drains of the plurality of cells for the predetermined duration of time, wherein the gate bias voltage is in a range of between about 4.2V to 6.0V and the drain bias voltage is in a range of between about 0.0V and 0.5V.

5. The method of claim 4, wherein the gate bias voltage is about 6V, the drain bias voltage is about 0.5V, and the duration of time is between about 3 to 6 minutes.

6. The method of claim 1, wherein the applying gate bias voltage further comprises:
    applying the gate bias to all gates of the plurality of cells and a drain bias voltage on all drains of the plurality of cells for a predetermined duration of time.

7. The method of claim 1, further comprising:
    configuring a specific data pattern before the applying the gate bias voltage to the plurality of cells of the non-volatile memory array, wherein the data pattern is either a physical checkerboard pattern or an inverse of the physical checkerboard pattern;
    wherein the applying the gate bias voltage to the plurality of cells of the non-volatile memory array includes the applying the gate bias voltage to only a portion of the plurality of cells that conforms to the either the physical checkerboard pattern or the inverse of the physical checkerboard pattern.

8. A method of detecting an imminent read failure in a non-volatile memory array, comprising:
    applying a gate bias voltage, higher than a normal read voltage level, to a plurality of cells of the non-volatile memory array, wherein the normal read verify voltage level is a voltage applied to a gate of a cell of the plurality of cells of the non-volatile memory array to determine a value stored by the cell;
    performing, subsequent to the applying the gate bias voltage, an initial array integrity check on the non-volatile memory array at the normal read verify voltage level;
    determining if the initial array integrity check on the plurality of cells passed at the normal read verify voltage level without using error correcting code (ECC) correction;
    if the initial array integrity check on the plurality of cells passed at the normal read verify voltage level without using ECC correction, indicating a pass status; and
    if the initial array integrity check on the plurality of cells did not pass at the normal read verify voltage level without using ECC correction:
        determining if the plurality of cells are ECC correctable;
        if the plurality of cells are not ECC correctable, indicating a fail status;
        if the plurality of cells are ECC correctable, performing an array integrity check of the plurality of cells at a margin read verify voltage level, wherein the margin read verify voltage level is either higher than the normal read verify voltage level for the plurality of cells or lower than the normal read verify voltage level for the plurality of cells; and
        indicating an imminent read failure for the plurality of cells when the plurality of cells exhibit the uncorrectable ECC read during the array integrity check at the margin read verify voltage.

9. The method of claim 8, wherein the margin read verify voltage level is above the normal read verify voltage level by about 0.5V.

10. The method of claim 8, wherein the margin read verify voltage level is below the normal read verify voltage level by about 0.5V.

11. The method of claim 8, further comprising:
indicating the pass status when the plurality of cells do not exhibit any uncorrectable reads during the array integrity check at the margin read verify voltage.

12. The method of claim 8, further comprising:
indicating the fail status when the plurality of cells exhibit any uncorrectable ECC reads during the array integrity check at the margin read verify voltage.

13. A memory system, comprising:
a non-volatile memory array; and
circuitry coupled to the non-volatile memory array, wherein the circuitry applies a gate bias voltage, higher than a normal read verify voltage level, to a plurality of cells of the non-volatile memory array, performs an initial array integrity check on the plurality of cells at the normal read verify voltage level subsequent to applying the gate bias voltage, determines whether the initial array integrity check on the plurality of cells pass at the normal read verify voltage level without using error correcting code (ECC) correction, determines, when the initial array integrity check on the plurality of cells did not pass at the normal read verify voltage level without using the ECC correction, whether the plurality of cells are ECC correctable, performs, when the plurality of cells are ECC correctable, a subsequent array integrity check of the plurality of cells at a margin read verify voltage level, and indicates an imminent read failure for the plurality of cells when the plurality of cells exhibit an uncorrectable ECC read during the subsequent array integrity check;
wherein the normal read verify voltage level is a voltage level applied to a gate of a cell of the plurality of cells of the non-volatile memory array to determine a value stored by the cell; and
wherein the margin read verify voltage level is either higher than the normal read verify voltage level for the plurality of cells or lower than the normal read verify voltage level for the plurality of cells.

14. The memory system of claim 13, wherein the margin read verify voltage level is above the normal read verify voltage level by about 0.5V.

15. The memory system of claim 13, wherein the margin read verify voltage level is below the normal read verify voltage level by about 0.5V.

16. The memory system of claim 13, wherein the circuitry further indicates a pass status when the plurality of cells pass the initial array integrity check without ECC correction.

17. The memory system of claim 13, wherein the circuitry further indicates a pass status when the plurality of cells do not exhibit any uncorrectable reads during the subsequent array integrity check.

18. The memory system of claim 13, wherein the circuitry further indicates a fail status when the plurality of cells are not ECC correctable during the initial array integrity check, and indicate a fail status when the plurality of cells exhibit any uncorrectable reads during the subsequent array integrity check.

\* \* \* \* \*